US005219702A

United States Patent [19]

Held

[11] Patent Number: 5,219,702

[45] Date of Patent: Jun. 15, 1993

[54] PROCESS FOR DETACKIFYING TRANSFERRED TONED IMAGES

[75] Inventor: Robert P. Held, Englishtown, N.J.

[73] Assignee: E. I. Du Pont de Nemours and Company, Wilmington, Del.

[21] Appl. No.: 661,752

[22] Filed: Feb. 27, 1991

[51] Int. Cl.[5] .......... G03F 3/10; G03F 7/28

[52] U.S. Cl. .......... 430/199; 430/254; 430/291; 430/293; 430/961

[58] Field of Search .......... 430/199, 200, 254, 291, 430/293, 961

[56] References Cited

U.S. PATENT DOCUMENTS

| | | | |
|---|---|---|---|
| 4,461,823 | 7/1984 | Held | 430/120 |
| 4,469,625 | 9/1984 | Held | 252/514 |
| 4,869,996 | 9/1989 | McCartin et al. | 430/286 |
| 4,902,594 | 2/1990 | Platzer | 430/961 |
| 5,039,588 | 8/1991 | Held et al. | 430/109 |

*Primary Examiner*—Charles L. Bowers, Jr.
*Assistant Examiner*—Mark F. Huff

[57] ABSTRACT

A process for transferring toned images to an image receptor at low temperatures with improved back transfer characteristics.

17 Claims, No Drawings

PROCESS FOR DETACKIFYING TRANSFERRED TONED IMAGES

FIELD OF THE INVENTION

This invention relates to a process for using prolonged tack toners and, in particular, to an improved process for using non-electroscopic prolonged tack toners for transferring toned images to image receptors at low temperature with reduced back transfer of the transferred image.

BACKGROUND OF THE INVENTION

Prolonged tack toners prepared from thermoplastic resins and a plasticizer are well known in the art. Upon heating the thermoplastic resin and plasticizer mixture, the mixture becomes tacky or sticky and remains tacky for a considerable time even after cooling. This property is known as delayed tack or setting and has been found useful in the preparation of adhesive compositions, as well as in thermography, to produce a master which is imagewise exposed by means of heat, toned, and the toned image is then transferred onto an image receptor to provide a copy of the original image. In the above-described process, the prolonged tack property is present in the form of a continuous film over an imagewise tacky element.

The prolonged tack toners and transfer process described above can be used to make four-color proofs. For example, in preparing a four-color proof consisting of cyan, magenta, yellow, and black, the cyan toner image is transferred to a receptor. The magenta toner image is then transferred to the same receptor, with the two images in register. The yellow image is then transferred and finally, the black image is transferred so that all four images are in register. However, if the transferred toned image on the receptor remains tacky when the next color is transferred, the image on the receptor can back transfer to the surface of the photopolymer surface of the next color, resulting in partial image loss from the receptor to the photopolymer. Back transfer problems and the resulting image loss are unacceptable in the printing industry.

U.S. Pat. 4,461,823, issued to Held on Jul. 24, 1984, describes multiple transfer of tacky image areas using prolonged tack toners wherein the toners can be prepared by combining a thermoplastic resin, e.g., polystyrene, with a plasticizer or a copolymer of methylmethacrylate (90)/methacrylic acid (10) and triphenyl phosphate plasticizer. A dye or colored pigment can be combined with the resin/plasticizer component. One of the main disadvantages with these toners is that it is difficult to transfer a toned image to an image receptor at low temperatures without getting some back transfer when transferring the next color.

U.S. Pat. No. 4,469,625, issued to Held on Sep. 4, 1984, describes prolonged tack toners for the preparation of electric circuits. Examples of organic polymers and plasticizers are described in column 1 and include polystyrene and N-cyclohexyl-p-toluenesulfonamide, poly(methylmethacrylate) (90)/methacrylic acid (10) and triphenyl phosphate. One of the main disadvantages using these toners is that it is difficult to transfer a sufficient amount of toner to an image receptor at a low temperature.

U.S. Pat. No. 5,039,588 issued to Held on Aug. 13, 1991, describes a non-electroscopic prolonged tack toner comprising an organic, thermoplastic terpolymer, a solid plasticizer and optionally a colorant wherein said toner is suitable for transferring toned images at low temperatures to an image receptor. The toners can be used to make a four-color proof. The toned image is transferred to a receptor. However, on subsequent transfers back transfer of the previously transferred image is observed.

U.S. Pat. No. 4,869,996 issued to McCartin et al. on Sep. 26, 1989, describes an improved process for preparing negative images from a positive-type photosensitive element. The process utilizes two separate applications of contrasting toning materials in order to produce a negative image. Each application of toning material is carried out at a different temperature. The process can also be used to produce positive images as well as negative multi-layer, multi-color images.

SUMMARY OF THE INVENTION

This invention relates to a process for forming an image from an element having a latent image, said image having toner receptive and background areas which comprises:

(a) applying to the latent image of the element a prolonged tack toner to produce a non-tacky toned image;

(b) heating the toned image to a temperature sufficient to activate the toner by rendering the toner tacky;

(c) bringing the tacky toned element into contact with an image receptor, and, while the toner is still activated;

(d) separating the element and image receptor whereby a portion of the activated prolonged tack toner transfers imagewise to the receptor;

(e) applying a colorless, fusible, finely divided particulate material to the transferred toned image on the receptor, said particulate material having a melting point greater than the melting point and transfer temperature of the prolonged tack toner; and (f) heating the transferred toned image on the receptor to a temperature above the melting point of the colorless, fusible finely divided particulate material.

DETAILED DESCRIPTION OF THE INVENTION

The term "prolonged tack toner" means a toner that is non-tacky at normal room temperatures but upon heating to an elevated temperature becomes and remains tacky for a period of time even though the temperature of the toner returns or is returned to a temperature below the temperature at which the toner became tacky, including room temperature. Such toners are sometimes referred to as delayed tack toners.

The term "non-electroscopic" means that the toners are neither repelled from nor attracted to a charged rod when placed in close proximity to the particles.

A latent tacky image has tacky toner-receptive areas and non-tacky background areas. The image is formed from films comprising a support with a photosensitive layer. The films are capable of forming imagewise tacky and non-tacky images on their surface, either directly, e.g., by exposure to actinic radiation, or by treatment with solutions, heat, or other means. Preferably the tacky images are formed in photosensitive layers which comprise positive-working or negative-working compositions. Suitable positive-working compositions are photohardenable, e.g., photopolymerizable compositions disclosed, for example, in Chu and Cohen, U.S. Pat. No. 3,649,268 and suitable negative-working compositions are disclosed for example, in Abele and Grossa, U.S. Pat. No. 4,243,741 and Cohen and Fan, U.S. Pat. No. 4,174,216, Dueber, U.S. Pat. No. 4,162,162, and Kempf, U.S. Pat. No. 4,859,551.

The terms "photopolymerizable" and "photohardenable" as used herein refer to systems in which the molecular weight of at least one component of the photosensitive layer is increased by exposure to actinic radiation sufficiently to result in a change in the rheological and thermal behavior of the exposed areas.

One of the problems with conventional toners is that it is very difficult to transfer toned images to an image receptor without back transfer problems because the transferred image on the receptor remains tacky. Usually, image formation using multiple transfers, e.g., in making a four-color proof, effected at low temperatures using conventional toners has been inferior.

Surprisingly and unexpectedly, it has been found that back transfer can be substantially reduced by (1) toning a transferred image with a material that seals or blocks the surface and (2) heating the transferred toned image. Specifically, back transfer problems can be improved by applying a colorless, fusible, finely divided particulate material to a transferred image on the receptor. The colorless, fusible, finely divided particulate material should have a melting point greater than the melting point and transfer temperature of the prolonged tack toner used to generate the image on the receptor. Following application of the particulate material, the transferred toned image is subsequently heated to a temperature above the melting point of the colorless, fusible finely divided particulate material.

The toners used in the process of the invention can be made readily as described in Example 1 below. These toners facilitate high quality transfers of toned images to image receptors at low temperatures. Multi-copy transfer can occur at low temperature thereby simplifying the process and eliminating heat distortions. Thus, greater resolution is obtained. The non-electroscopic, prolonged tack toners used in the process of the invention comprise an organic, thermoplastic terpolymer and a solid plasticizer. Optionally, a colorant may be added to the terpolymer/plasticizer mixture.

The organic thermoplastic terpolymer consists of substantially equal percentages by weight of styrene, alpha-methyl styrene and an acid selected from the group consisting of acrylic acid and methacrylic acid which can be made using conventional techniques such as solution polymerization. The preferred acid is acrylic acid. The terpolymer has an average molecular weight in the range from 1,000 to 100,000, preferably 1,500 to 10,000 and. most preferably, 2,000 to 8,000. It is present in an amount from 10% by weight to 70% by weight based on total toner weight and, more preferably, 20% to 50%. Other acrylate based polymers such as copolymers of methyl methacrylate/acrylic acid (90/10), molecular weight 20,000, can be used as well.

A solid plasticizer is added to the organic thermoplastic terpolymer. Plasticizers suitable for practicing the invention include triphenyl phosphate, diphenyl phthalate, dicyclohexyl phthalate, or N-cyclohexyl-p-toluenesulfonamide. However, the preferred plasticizer is triphenyl phosphate. The plasticizer is present in an amount from about 30% to about 90% by weight based on total toner weight. The preferred range is from about 50% to about 70% based on total toner weight.

Optionally, a colorant, such as a dye or pigment, can be added to the terpolymer/plasticizer mixture. A number of dyes and pigments known to those skilled in the art can be used. Colorants suitable for practicing the invention include a dye or pigment such as carbon black which can be combined with the terpolymer and plasticizer. The colorant is present in an amount from 0% to 50% based on total toner weight and, more preferably, from 0.5% to 20%.

The toner particles have a size distribution within the range of 0.2 to 30 micrometers and not more than 50% of the toner particles are less than 1 micrometer particle size as described in U.S. Pat. No. 3,620,726.

The toners used in the process of the invention are used to tone photopolymerizable or photohardenable elements comprising photopolymerizable or photohardenable compositions on supports. There can be mentioned as photopolymerizable or photohardenable compositions: (1) those in which a photopolymerizable monomer is present alone or in combination with a compatible binder, or (2) those in which the photopolymerizable groups are attached to a polymer backbone which becomes activated to light and can then crosslink by reacting with a similar group or other reactive sites on adjacent polymer chains. Photopolymerizable systems of the latter type where the monomer or pendant photopolymerizable group is capable of addition polymerization, e.g., a vinyl monomer, the photopolymerized chain length can involve addition of many similar units initiated by a single photochemical event. Where only dimerization of similar compounds is involved, e.g., benzophenone or cinnamoyl compounds, the average molecular weight of the photosensitive constituent can be at best only doubled by a single photochemical act. Where a photopolymerizable molecule has more than one reactive site, a crosslinked network can be produced.

If either a simple monomer or monomer-polymer binder composition is being used, the photosensitive layer preferably contains a free radical generating, addition polymerization initiator. Plasticizing agents, as well as other known additives, can be present in the photosensitive layer.

Free radical initiated, chain propagating, additional polymerizable layers which can be used to practice the invention are described in U.S. Pat. Nos. 3,060,023, 3,261,686 and 3,380,831 and are herein incorporated by reference. Polymers for use in the monomer-polymer binder system and preferred free radical generating addition polymerization initiators are described in U.S. Pat. No. 3,060,023 and are herein incorporated by reference.

Photodimerizable materials useful in practicing the invention include cinnamic acid esters of high molecular weight polyols, polymers having chalcone and benzophenone type groups, and others disclosed in Chapter 4 of "Light-Sensitive Systems" by Jaromir Kosar, published by John Wiley & Sons, Inc., New York, 1965. Photopolymerizable materials capable of photocrosslinking with more than one adjacent polymeric chain to form a network are described in U.S. Pat. Nos. 3,418,295 and 3,469,982.

Preferred free radical generating addition polymerization initiators, activatable by actinic radiation, e.g., ultraviolet and visible radiation, are listed in U.S. Pat. No. 3,060,023 and the other patents referred to above.

Plasticizing agents which can be present in the photosensitive layer include dialkyl phthalate, polyoxyethylene(4)monolaurylether, polyethylene glycol, triethylene glycol diacetate, alkyl phosphates, etc.

A photosensitive layer, 0.0003 to 0.004 inch (0.0076 to 0.10 mm) thick, is present on a support such as a polymer film, plastic, metal or sheet such as paper whereon it adheres. The photosensitive composition can be either laminated or coated on the support under conditions known to those skilled in the art. A known protective film such as the one described in U.S. Pat. No. 3,060,026 can be present on the photosensitive layer. A protective film, such as polyethylene terephthalate, polyethylene, etc., can be present during imagewise exposure but is removed prior to application of the non-electroscopic, prolonged tack toner to the tacky imaged surface.

The photopolymerizable layer is exposed to actinic radiation, generally through a process negative or positive transparency. The transparency is an image-bearing transparency consisting solely of substantially opaque and substantially transparent areas where the opaque areas are substantially of the same optical density.

Photosensitive compositions used in the process of this invention generally exhibit their maximum sensitivity in the ultraviolet range, therefore, the radiation source should furnish an effective amount of this type of radiation having a wavelength range between 320–400 nm, and for blue sensitive photopolymers, the wavelength range is between 400–500 nm, usually with appropriate filters to get the desired wavelengths. Suitable radiation sources include carbon arcs, mercury-vapor arcs, fluorescent lamps with special ultraviolet-emitting phosphors, argon glow lamps, electronic flash units and photographic flood lamps. The radiation exposure time can vary from fractions of a second to minutes, depending upon the intensity, type of radiation source used, its distance from the photopolymer element and nature and amount of photopolymer element. In general, exposure times range from 10 seconds to 10 minutes or more using standard commercial radiation sources.

Following imagewise exposure and removal of the cover sheet, the image is developed by toning the tacky image areas with particles of a non-electroscopic, prolonged tack toner of the type described above. The toner particles adhere primarily in the tacky image areas. Any toner particles remaining in the non-tacky background areas can be removed by means known in the art, e.g., wiping, air devices, etc. The prolonged tack toner particles are activated by heating the toner particles to at least a temperature wherein the toner particles become tacky.

The activated tacky toned image-bearing substrate is then brought into intimate contact, under pressure, at a low temperature in the range from 20° C. to 70° C. with an image receptor. Image receptors suitable for practicing the invention include paper, uncoated or coated paper such as Kromekote®, film such as polyethylene terephthalate, or metals such as aluminum copper clad fiberglass, epoxy, or phenolic resin board.

Following separation of the element from the image receptor, the toner fails cohesively and a portion thereof transfers imagewise to the image receptor. At this point, the transferred toned image is tacky and after reducing the temperature of the prolonged tack toner particles to below their activating temperature, the prolonged tack toner particles remain tacky for a period of time. The transferred toned image on the receptor is then retoned with a colorless, fusible, finely divided particulate material having a melting point greater than the melting point and transfer temperature of the prolonged tack toner used in the tone-melt-transfer-process discussed above. The transferred image is subsequently heated to a temperature above the melting point of the fusible finely divided particulate material. The process can be repeated to receive each additional transferred image and thereby produce a multi-layered image with improved back transfer characteristics.

The clear, colorless fusible particulate material or blocking toner should satisfy a number of requirements. First, the powder should be fusible to form a continuous film at a temperature above the melting point and transfer temperature of the prolonged tack toner. If the fusion temperature is too low, the fused film will be soft at the next transfer step and thus back transfer to the surface of the photopolymer layer of the next image. The congealing or freezing temperature and the melting temperature of the fusible toner must lie within a narrow enough range so that the fused film is sufficiently hard at the second transfer step to prevent back transfer. Secondly, the material should be colorless to avoid changing the image characteristics with regard to color quality.

Few materials possess all the properties of hardness, insolubility, and melting point necessary in a fusible material or blocking toner. Surprisingly and unexpectedly, it has been found that polyethylene does meet these requirements. However, even among various polyethylene materials, structural requirements are quite narrow. For example, the polyethylene should be non-branching or the material is too soft. Also, the molecular weight should be in the range of 300–3000, and preferably 500–1200. The molecular weight is an important determinant with respect to the melting point value and range. The particle size of the fusible toner is also important because particle size effects image quality, as well as the ease of fusion, smoothness, and uniformity of the film formed upon melting. Thus, in order to form a film of the appropriate uniformity and smoothness, the polyethylene particles should have a mean diameter of 0.50 to 15 micrometers, preferably 0.8 to 10 micrometers, and more preferably 1.0 to 7 micrometers. A narrow range is preferred because it produces a smoother and more uniform film.

The colorless, fusible, finely divided particulate material can be a thermoplastic polyester having a low melt viscosity and a Tg of between 50° and 60° C. Alternatively, the particulate material can be selected from copolymers of styrene having an average molecular weight range of 30,000 to 100,000, with glass transition temperatures in the range of 50°–65° C. Polyester and polyamides can be used without further compounding to give sharp melting materials.

Oxidized forms of polyethylene are not useful. Similar materials such as synthetic and natural waxes, including various hydrocarbon, Carnauba wax, fatty acid amides, Fischer-Tropsch waxes, and microcrystalline waxes, are too soft. However, polyethylene/vinyl acetate copolymers compounded with these waxes can be used as the fusible material.

An image capable of accepting a prolonged tack toner of the type disclosed below, a method for applying prolonged tack toner thereon, a colorless, fusible, finely divided particulate material applied to the transferred image, and a heating source to heat the transferred toned image are needed to practice the process of the invention.

The automatic toning apparatus described in U.S. Pat. No. 4,069,791 and the toning and transfer apparatus described in U.S. Pat. No. 4,461,823, the disclosures of which are hereby incorporated by reference, can be used to practice the invention.

Radiative and conductive heat may be used to fuse the transferred toned image. Heat sources suitable for practicing the invention include a hot plate, a quartz heater, cal-rod heaters, etc.

Prolonged tack toned images of the types described above can be used in single or multiple transfers to an image receptor using the same or different toners. The transferred image can also be toned subsequently with additional prolonged tack toner to generate a higher density transferred image. Multicolored images can be prepared on at least one image receptor by preparing a desired number of photosensitive elements, e.g., at least two and, preferably, four, exposing each element through a different color separation transparency and toning each imagewise tacky element with the appropriately colored prolonged tack toner. Each toned image is then transferred in register to the same image receptor, toned with the colorless, fusible material and then heated to detackify it. Thus, using the toners of the instant invention, a four-color proof can be made without any back transfer problems.

The invention is useful for the preparation of toned images of high optical density wherein a tackified toned image on an element is retoned with additional toner a number of times, so as to build the image density on the surface of the element to any desired point.

Furthermore, high optical densities can be obtained on different image receptors by reheating the toned image left behind on the element after the initial transfer, followed by partially transferring this reheated toned image to a different image receptor, reducing the temperature of the transferred toned image below the activating temperature of the prolonged tack toner wherein the toner remains tacky and retoning the transferred toned image with additional dry particulate prolonged tack toner.

Resist images can be formed by transferring the toned image to copper clad laminates, e.g., phenolic resin or fiberglass epoxy boards, for example, and subsequently etching or plating the boards in the conventional manner.

Lithographic printing plates can also be prepared by transferring the toned image to a lithographic surface, e.g., an aluminum plate, at a temperature in the range from 20° C. to 70° C. The transferred image is then treated and inked to produce inked impressions of the image.

Heretofore, it has been quite difficult to transfer an image from an element to an image receptor using conventional toners. As is shown in the examples below, the process described herein makes it possible to transfer images to image receptors at low temperatures with reduced back transfer.

The following examples illustrate the practice of the invention.

EXAMPLES

In the following examples, all percentages are by weight unless otherwise specified.

All toners were evaluated according to the procedure described in Example 1 unless otherwise specified.

EXAMPLE 1

A cyan toner was prepared according to the following procedure:

26.4 grams (6.6%) of Heliogen® Blue K 7090 (BASF Corp., Holland, Mich. 49423), 244.4 grams (61.1%) of triphenyl phosphate (Monsanto Company, St. Louis, Mo. 63167) and 129.2 grams (32.3%) of a terpolymer consisting of approximately equal percentages by weight of styrene, alpha-methyl-styrene and acrylic acid and having a weight average molecular weight of ca. 2500 were placed in a 2 quart Bain Marie container (Le Beau Products, Baraboo, Wis. 53913). A 6 inch (15.24 cm) stainless steel chain was added and the mixture shaken on a Paint Conditioner, Model MKI-R (Red Devil,.Inc., Union, N.J. 07083) for 30 minutes.

The mixture was slowly added to a 2 roll rubber mill at 50°-55° C. so that a continuous molten band formed. The mill had 6 inch (15.24 cm) diameter rolls, 13 inches (30.48 cms) wide (William Thropp & Sons, Salem, Ohio 44460). The mixture was cut by a doctor blade and returned repeatedly to the mill to reband for 20 minutes. The dispersion was then left on the rotating rolls for another 20 minutes. After removal from the rolls, it was cooled and broken up into 1-3 inch (2.54-7.62 cm) chips which were sufficiently small to be fed to a hammer mill.

The chips were then fed to a Reitz mill to produce a course powder. The powder was fed to an 8 inch (20.32 cm) jet mill (Jet Pulverizer Co., Palmyra, N.J.) at 50 grams per minute. Particle size was obtained on a Coulter Counter Model TAII (Coulter Electronics, Inc., Hialeah, Fla. 33010) with a 30 micron aperture. Population average was 1.6 microns. Volume average was 13.0 microns.

The 2 roll mill temperature was followed fairly closely. If the temperature rises much above 55° C. the melt will become too fluid and drip from the mill. If much below 50° C. the mass will not melt and dispersion will not take place.

A photopolymerizable element similar to that described in U.S. Pat. No. 4,461,823 was placed in a vacuum frame, with the cover sheet facing the glass cover of the vacuum frame. A transparency bearing a positive halftone image of the subject to be reproduced was then placed over the cover sheet, and the vacuum frame glass cover closed. A vacuum of about 25 inches of water (approx. 635 kg/m$^2$) was applied to assure intimate contact of the transparency and the element. Using a 5 KW mercury vapor light source at a distance of 58 inches (147.3 cms), the photopolymer element was given a 35 second exposure. As a result of the exposure to actinic radiation, the unexposed areas of the photopolymerizable layer surface were imagewise tacky and the exposed areas were non-tacky.

The element was then removed from the vacuum frame and the cover sheet was peeled off. The exposed element was toned by hand using an acrylic pad material attached to a plastic handle, whereby the toner prepared as described above was applied over the exposed photopolymerizable surface. Toner particles adhered to the tacky areas and the remaining toner was wiped off the element by a special cloth (Las-Stik® manufacture by Las-Stik Manufacturing Co., Hamilton, Ohio). The toned element was subsequently subjected to heating to 135° F. (57.2° C.) for about 1 minute on a heating plate. The image was then transferred to a Kromekote® receptor manufacture by the Champion Paper Co. at a transfer speed of 3.5 ft/min (0.5 cm/sec) in a modified Cromalin® laminator manufactured by Du Pont equipped with a metal heated roll at 50° C. and an unheated roll. The transferred image on Kromekote® was then toned with a colorless, fusible, finely divided particulate material having the following composition:

80% Shell® wax 200, polyethylene (Shell)

20% Elvax® 410, a copolymer of ethylene/vinyl acetate (Du Pont)

The toned transferred image was subsequently heated by convection on a hot plate at 85° C. for about one minute. Prior to toning with the fusible material and heating, the image was tacky to the touch, but after heating the image was no longer tacky.

EXAMPLE 2

A magenta toner was prepared according to the procedure described in Example 1 with the following exceptions:

22.2 grams Quindo® Magenta RV-6803 (Mobay Corp., Haledon, N.J. 07508), 4.2 grams Indofast Brilliant Scarlet R-6300 (Mobay Corp.), 200.0 grams triphenyl phosphate and 173.6 grams of terpolymer from above were used to prepare a magenta toner. The particle size was obtained on a Coulter Counter using a 30 micron aperture. Population average was 1.6 microns. Volume average was 3.0 microns.

This toner was used to make a magenta image as described in Example 1. The transferred image was toned with a colorless, fusible, finely divided material of the same formulation described in Example 1 and heated as described earlier. Prior to toning with the fusible material and heating, the image was tacky to the touch, but after heating the image was no longer tacky.

EXAMPLE 3

A black toner was prepared according to the procedure described in Example 1 with the following exceptions:

31.2 grams Sterling NS (Cabot Corp., Waltham, Mass. 02254), 240 grams triphenyl phosphate, and 128.8 grams of terpolymer from above were used to prepare a black toner.

Mean particle size was 2.3 microns as measured on a Microtrac® Particle Analyzer (Leeds and Northrup Instruments, North Wales, Pa. 19450).

This toner was used to make a black image as described in Example 1. The transferred image was toned with a colorless, fusible, finely divided material of the same formulation in Example 1 and heated as described earlier. Prior to toning with the fusible material and heating, the image was tacky to the touch, but after heating the image was no longer tacky.

EXAMPLE 4

A yellow toner was prepared according to the procedure described in Example 1 with the following exceptions:

28.0 grams Dalamar® Yellow, YT-858-D (Heubach, Inc., Newark, N.J. 07114), 240 grams triphenyl phosphate, and 132 grams of terpolymer from above were used to prepare a yellow toner.

The mean particle size as measured on a Microtrac® Particle Analyzer was 3.0 microns.

This toner was used to make a yellow transferred image as described in Example 1. The transferred image was toned with the colorless, fusible, finely divided material of the same formulation described in Example 1, and heated as described earlier. Prior to toning with the fusible material and heating, the image was tacky to the touch, but after heating the image was no longer tacky.

EXAMPLE 5

The toners and transfer process described above were used to make a four-color proof. First, the cyan image was produced on Kromekote® paper as described in Example 1 using the toner of Example 1. Second, the magenta image was generated as described in Example 2 using the toner of Example 2, except that the transfer was made on top of the cyan image in register using standard pin registration for the exposure and transfer steps. Third, the yellow image was produced as described above using the yellow toner of Example 3 which was transferred, in register, on top of the magenta image. Finally, the black image was transferred, in register, on top of the yellow image using the toner of Example 4.

After each transfer, the transferred image was toned with a colorless, fusible, finely, divided material of the same formulation described in Example 1, and heated as described earlier. There was no back transfer of the images from the paper to the next photopolymer surface. Thus, a high quality four-color proof was generated.

EXAMPLE 6

The toners described in Example 1–4 were used to prepare a four-color proof as described in Example 5 with the following exception: the colorless powder applied to the image on paper was an unsaturated, bisphenol-A-propoxylated fumarate (Atlac® 382E manufactured by ICI Americas, Inc., Wilmington, Del.). There was no back transfer of the images from the paper to the next photopolymer surface. Thus, a high quality four-color proof was generated.

What is claimed is:

1. A process for forming an image from an element having a latent image, said image having toner receptive and background areas which comprises:

(a) applying to the latent image of the element a prolonged tack toner to produce a non-tacky toned image;

(b) heating the toned image to a temperature sufficient to activate the toner by rendering the toner tacky;

(c) bringing the tacky toned element into intimate contact with an image receptor, and, while the toner is still activated, (d) separating the element and image receptor whereby a portion of the activated prolonged tack toner transfers imagewise to the receptor, (e) applying a colorless, fusible, finely divided particulate material to the transferred toned image on the receptor, said particulate material having a melting point greater than the melting point and transfer temperature of the prolonged tack toner; and (f) heating the transferred toned image on the receptor to a temperature above the melting point of the colorless, fusible, finely divided particulate material.

2. The process according to claim 1 wherein the following is performed after step (d):

(d') reducing the temperature of the tackified toned image on the element below the activating temperature of the prolonged tack toner wherein the toner remains tacky, (d″) applying dry particulate prolonged tack toner over the remaining tacky toner on the element, and (d‴) repeating steps (b) through (d) at least one time using a separate image receptor in step (c).

3. The process according to claims 1 or 2 wherein the colorless, fusible, finely divided particulate material consists essentially of a linear, low molecular weight polyethylene, having a mean particle diameter of about 0.5 to about 15 micrometers, and a molecular weight in the range of about 300 to about 3000.

4. The process according to claim 3 wherein the polyethylene has a molecular weight in the range of about 500 to about 1200.

5. The process according to claims 1 or 2 wherein the colorless, fusible finely divided particulate material consists essentially of a thermoplastic polyester having a low melt viscosity and a Tg in the range of about 50° to about 60° C.

6. The process according to claims 1 or 2 wherein the colorless, fusible, finely divided particulate material consists essentially of a copolymer of styrene having an average molecular weight in the range of about 30,000 to about 100,000 and a Tg in the range of about 50° to about 60° C.

7. The process according to claims 1 or 2 wherein the colorless, fusible, finely divided particulate material consists essentially of a polyamide.

8. The process according to claims 1 or 2 wherein the colorless, fusible, finely divided particulate material consists essentially of a polyethylene/vinyl acetate copolymer compounded with waxes.

9. The process according to claim 8 wherein the waxes are selected from the group consisting of hydrocarbon, Carnauba wax, fatty acid amides, Fischer-Tropsch waxes, and microcrystalline waxes.

10. The process according to claims 1 or 2 wherein the toned image is transferred at a temperature in the range from 20° C. to 70° c.

11. A process for forming an image from an element having a latent image having toner receptive and background areas which comprises:

(a) applying to the latent image of the element a prolonged tack toner to produce a non-tacky toned image;

(b) heating the toned image to a temperature sufficient to activate the toner by rendering the toner tacky;

(c) bringing the tacky toned element into intimate contact with an image receptor, and while the toner is still activated;

(d) separating the element and image receptor whereby a portion of the activated prolonged tack toner transfers imagewise to the image receptor;

(e) applying a colorless, fusible, finely divided particulate material to the transferred toned image on the receptor, said particulate material having a melting point greater than the melting point and transfer temperature of the prolonged tack toner; and (f) heating the transferred toned image on the receptor to a temperature above the melting point of the fusible finely divided particulate material, steps (a) to (f) being repeated at least two times using different elements having tacky toner receptive areas and non-tacky background areas formed therein by exposure with actinic radiation through different color separation transparencies and the transfer step is accomplished by transferring in register toners of appropriate color with respect to the separation transparencies onto a single image receptor.

12. The process according to claim 11 wherein the following steps are performed after step (d):

(d′) reducing the temperature of the tackified toned image on the element below the activating temperature of the prolonged tack toner wherein the toner remains tacky, (d″) applying dry particulate prolonged tack toner over the remaining tacky toner on the element; and (d‴) repeating steps (b) through (f) at least one time using a separate image receptor in step (c).

13. The process according to claim 11 wherein the image receptor is paper.

14. The process according to claim 11 wherein the image receptor is coated paper.

15. The process according to claim 11 wherein the toned image is transferred at a temperature in the range from 20° C. to 70° C.

16. The process according to claim 11 wherein steps (a) to (f) are repeated four times.

17. The process according to claim 12 wherein steps (b) to (d‴) are repeated four times.

* * * * *